(12) United States Patent
Lee et al.

(10) Patent No.: US 6,271,999 B1
(45) Date of Patent: Aug. 7, 2001

(54) ESD PROTECTION CIRCUIT FOR DIFFERENT POWER SUPPLIES

(75) Inventors: Jian-Hsing Lee; Jiaw-Ren Shih; Yi-Hsun Wu; Jing-Meng Liu, all of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/196,603

(22) Filed: Nov. 20, 1998

(51) Int. Cl.[7] .................................................. H02H 9/00
(52) U.S. Cl. ............................................. 361/56; 257/567
(58) Field of Search ............................. 361/54, 56, 111, 361/58; 327/306, 309, 310, 318, 321; 257/567, 569, 355

(56) References Cited

U.S. PATENT DOCUMENTS

| | | | |
|---|---|---|---|
| 4,990,976 | 2/1991 | Hattori | 357/23.4 |
| 5,077,591 | 12/1991 | Chen et al. | 357/23.13 |
| 5,087,955 | 2/1992 | Futami | 357/41 |
| 5,159,518 | 10/1992 | Roy | 361/56 |
| 5,208,719 | 5/1993 | Wei | 361/56 |
| 5,274,262 | 12/1993 | Avery | 257/362 |
| 5,287,241 | 2/1994 | Puan | 361/56 |
| 5,290,724 | 3/1994 | Leach | 437/51 |
| 5,442,217 | 8/1995 | Mimoto | 257/361 |
| 5,568,345 | * 10/1996 | Mudd et al. | 361/56 |
| 5,616,943 | 4/1997 | Nguyen et al. | 257/355 |
| 5,774,318 | * 6/1998 | McClure et al. | 361/56 |
| 5,978,192 | * 11/1999 | Young et al. | 361/56 |
| 5,986,863 | * 11/1999 | Oh | 361/56 |
| 6,046,492 | * 4/2000 | Machida et al. | 257/567 |

OTHER PUBLICATIONS

S. Dabral et al. "Designing On–Chip Power Supply Coupling Diodes for ESD Protection and Noise Immunity" Proceedings of EOS/ESD Symposium 1993, pp. 5B.6.1–5B.6.11.

T.J. Maloney, "Novel Clamp Circuits For IC Power Supply Protection", Proceedings EOS/ESD Symposium 1995, pp. 1.1.1.–1.1.12.

* cited by examiner

Primary Examiner—Josie Ballato
(74) Attorney, Agent, or Firm—George O. Saile; Stephen B. Ackerman; Billy Knowles

(57) ABSTRACT

A voltage clamping circuit that protects integrated circuits having multiple separate power supply voltage terminals from damage when an ESD event causes excessive differential voltages between the multiple separate power supply voltage terminals. The voltage clamping circuit has two subgroups of Darlington connected clamping transistors. The first subgroup of Darlington connected clamping transistors is connected between the first power supply voltage terminal and the second power supply voltage terminal. If the differential voltage exceeds the first clamping voltage level, the first subgroup of Darlington connected clamping transistors turn on and restore the first differential voltage to a level less than the first clamping voltage level. The second subgroup of Darlington connected clamping transistors connected between the second power supply terminal and the first power supply terminal. If the differential voltage exceeds the second clamping voltage level, the second subgroup of Darlington connected transistors turn on and restore the differential voltage to a level less than the second clamping voltage level.

4 Claims, 7 Drawing Sheets

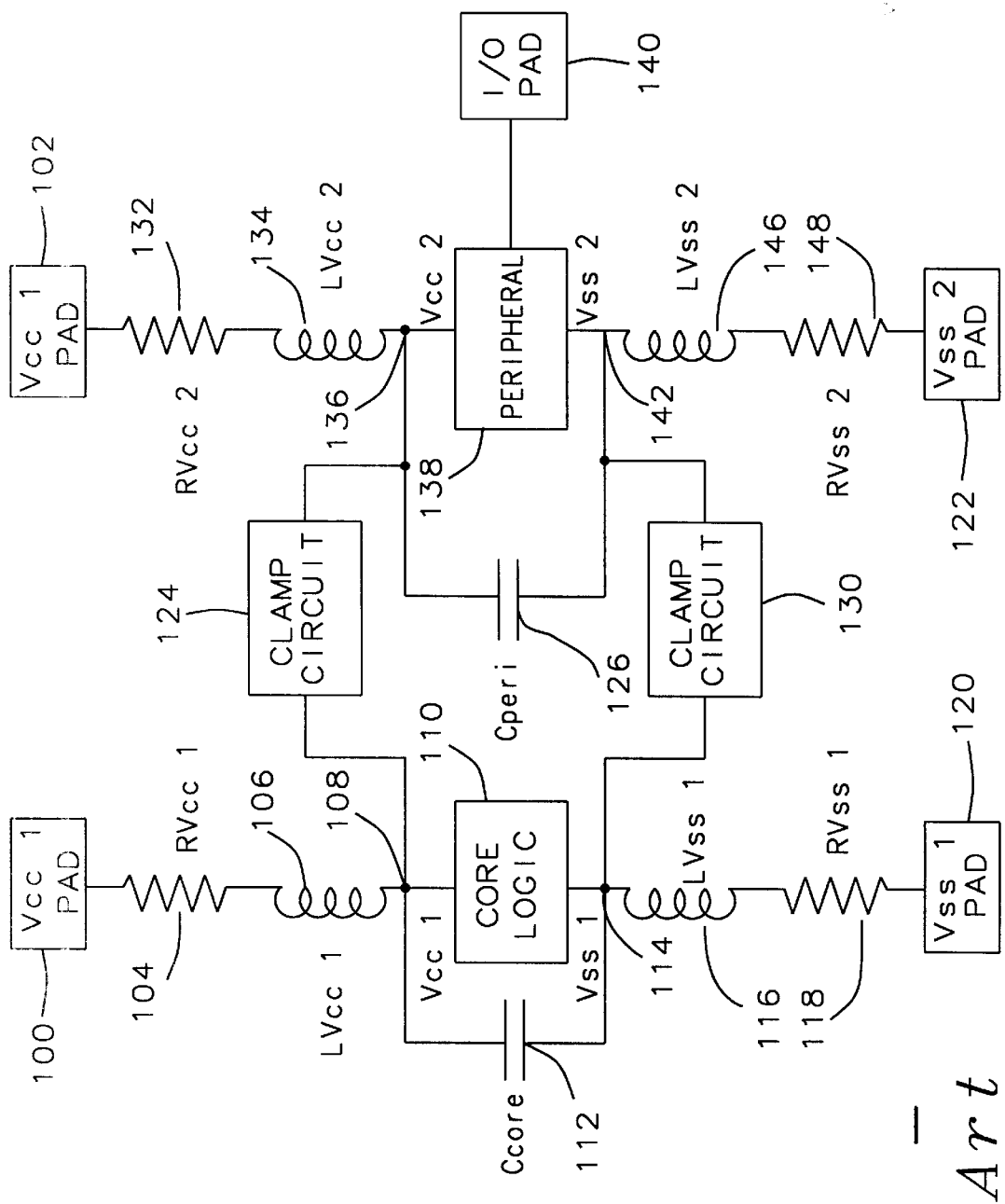
FIG. 1 –
Prior Art

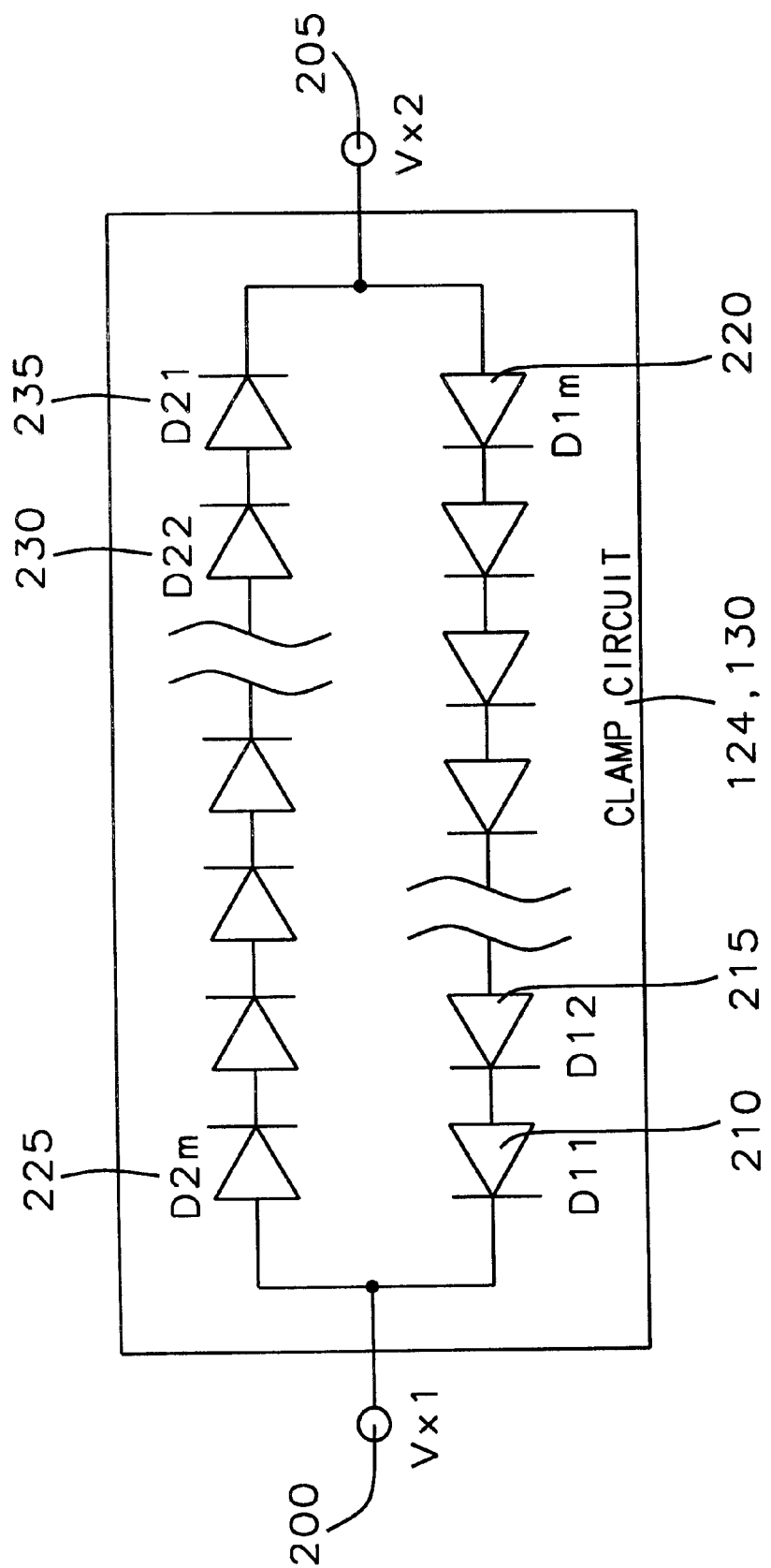
FIG. 2 – Prior Art

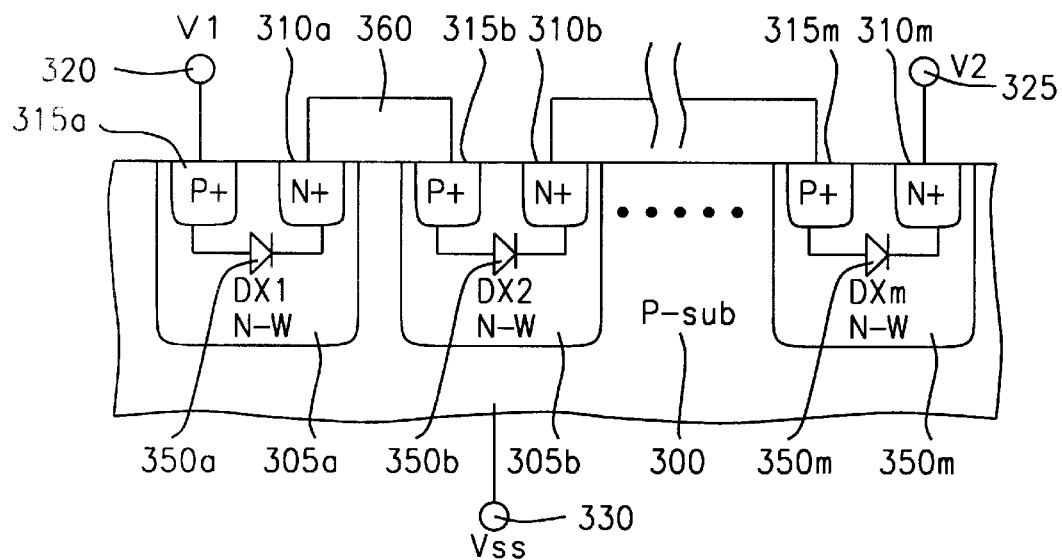
FIG. 3 – Prior Art
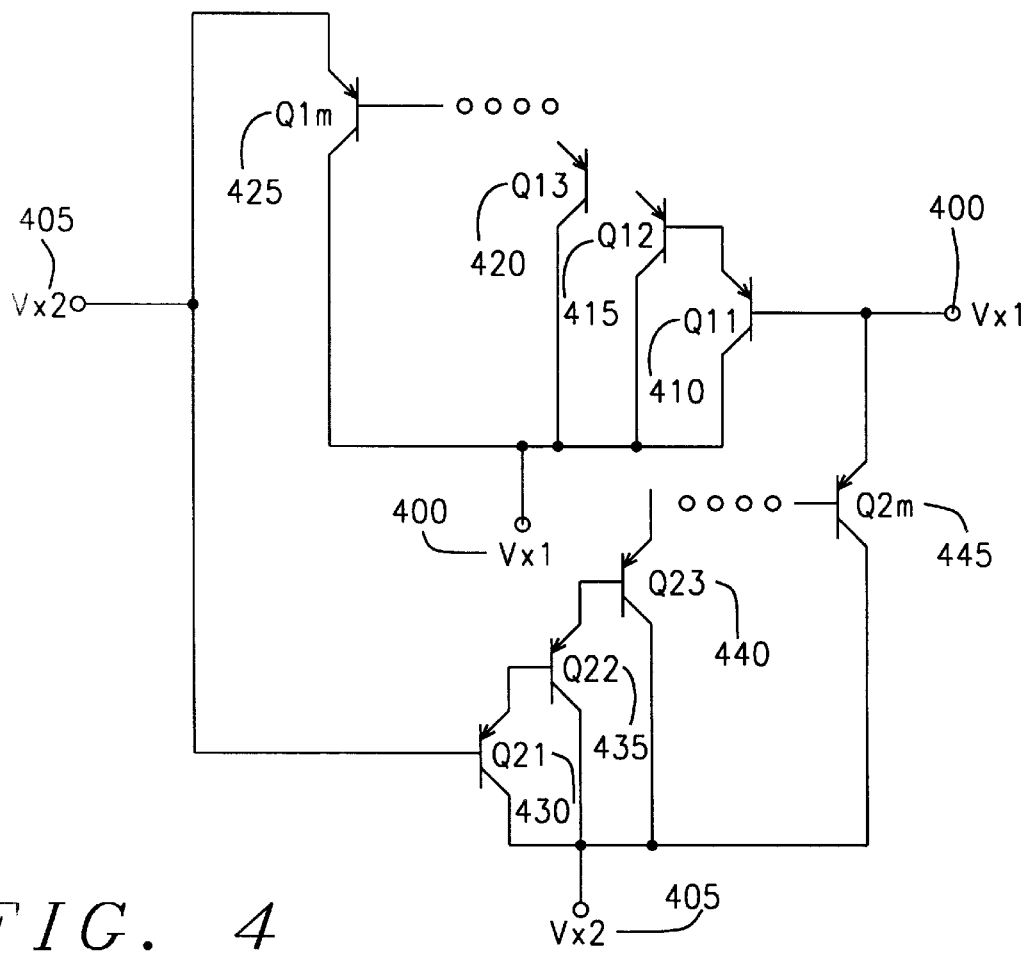
FIG. 4

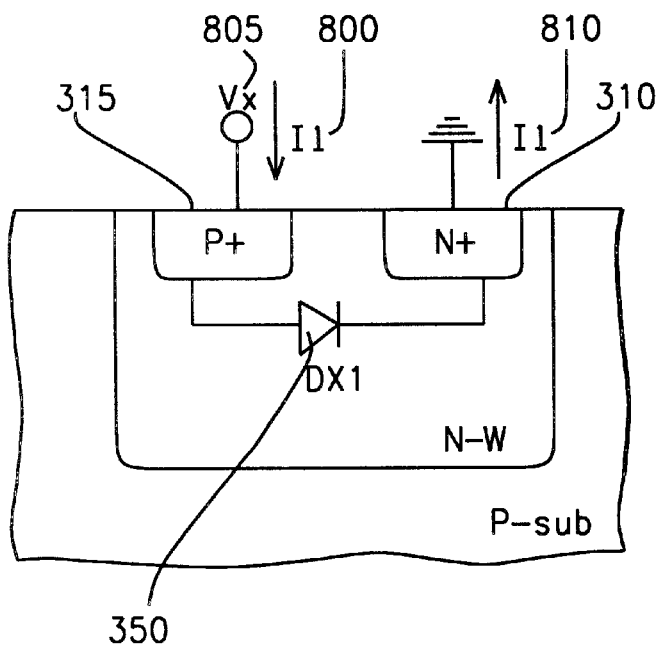
FIG. 8a – Prior Art
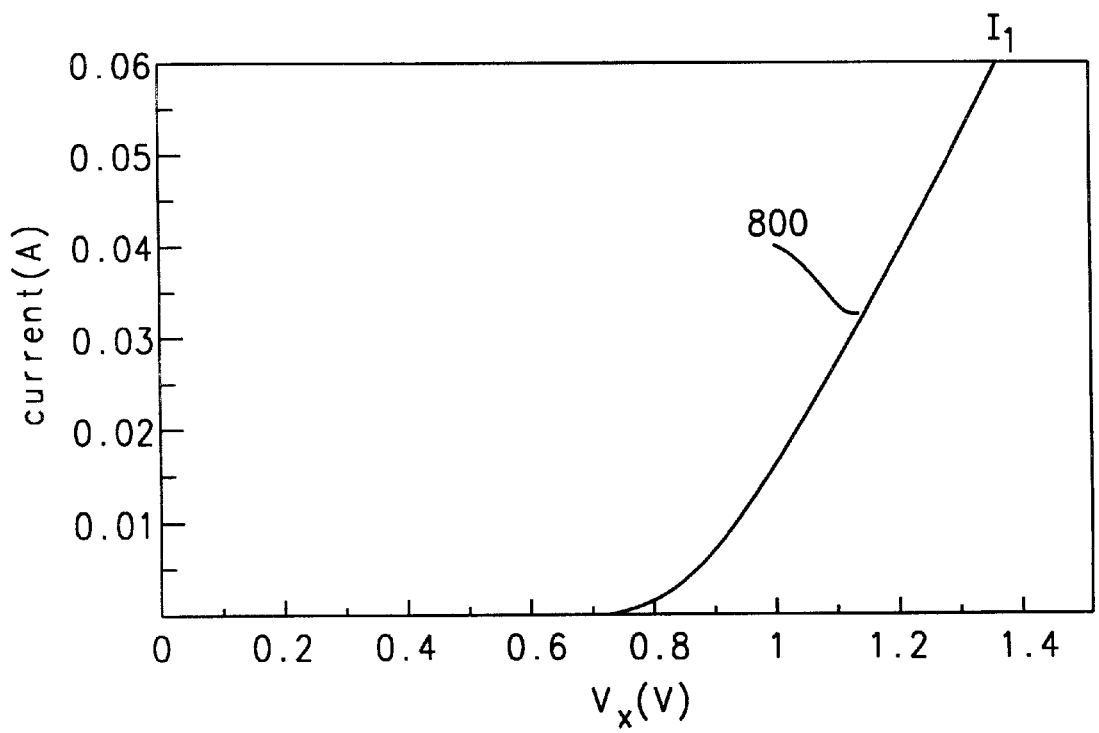
FIG. 8b – Prior Art

ESD PROTECTION CIRCUIT FOR DIFFERENT POWER SUPPLIES

BACKGROUND OF THE INVENTION

1. Field of the Invention

This invention relates to circuits an integrated circuit that provide protection from electrostatic discharge (ESD) events. More particularly, this invention relates to circuits that will prevent a differential voltage level between two different power supply voltage terminals from exceeding a specified voltage level and thus prevent damage to the integrated circuit.

2. Description of the Related Art

Application specific integrated circuits (ASIC) often have either multiple pads connected to a single power supply voltage source or multiple isolated power supply voltage sources. FIG. 1 shows a model power supply distribution system similar to that described in "Designing On-Chip Power Supply Coupling Diodes for ESD Protection and Noise Immunity," S. Dabral et al., Proceedings of EOS/ESD Symposium, 1993, pp. 5B.6.1–5B.6.11.

A power supply voltage source is connected through a distribution system between the Vcc pads 100 and 102 and the Vss pads 120 and 122. The structure of the ASIC shows a core logic section 110 and a peripheral logic section 138. In order to isolate noise, such as caused by simultaneous switching of driver circuits in the peripheral logic section 138 or impedance mismatch on transmission line connected to the I/O pad 136, the peripheral logic section 138 has a separate power supply distribution network from that of the core logic section 110.

The distribution of the power supply voltage Vcc through the Vcc pad 100 is modeled by the resistor RVcc1 104 the inductor LVcc1 106. The resistor RVcc1 104 represents the cumulative resistance of the wiring within the ASIC used to distribute the power supply voltage Vcc to the core logic section 110. The inductor LVcc 106 represents the inductance of the cumulate wiring within the ASIC used to distribute the power supply voltage Vcc to the core logic section 110.

The return of the power supply voltage Vss through the Vss pad 120 is modeled by the resistor RVss1 116 and the inductor LVss1 118. The resistor LVss1 116 and the inductor LVss1 118 represent respectively the distributed resistance and inductance of the wiring used to distribute the return of the power supply voltage Vss from the core logic section 110. The return of the power supply voltage Vss is often a common or ground reference point with the system containing the ASIC.

The capacitance Ccore 112 represents the capacitance of the circuitry of the core logic section 110 between the first power supply voltage node Vcc1 108 and the first return node Vss1 114 of the power supply voltage.

A similar structure is present at the peripheral logic section 138. The resistor RVcc2 132 and the inductor LVcc2 134 model the distribution wiring from the Vcc pad 106 and the peripheral logic section 138. The resistor RVss2 146 and the inductor LVss2 148 model the distribution wiring of the return of the power supply Vss from the peripheral logic section 138 and the Vss pad 122.

The capacitor Cperi represents the capacitance of the circuitry of the peripheral logic section 138 between the second power supply node Vcc2 136 and the second return node Vss 2 142 of the power supply voltage.

The first and second return nodes are generally connected to the semiconductor substrate on which the ASIC is constructed. However, the core logic section and the peripheral logic section may be constructed in a well having a doping of an impurity of a polarity opposite of the doping of the impurity of the semiconductor substrate. This would be an n-well on a p-type substrate or a p-well on an n-type substrate. This will further isolate the return nodes Vss1 114 and Vss2 142 from each other.

While the core logic section 110 and the peripheral logic section 138 were described above as having a common power supply voltage source Vcc, often the core logic section 110 has a power supply voltage source of a different voltage level than the peripheral logic section 138. The peripheral logic section may have a power supply voltage source Vcc of 5.0V and the core logic section may have a power supply voltage source Vcc of 3.3V. Further, ASIC implementations may have multiple core logic sections and multiple peripheral logic sections, as well as analog core sections. Each section will have a separate voltage distribution network for the power source and return paths. The models for these voltage distribution networks is as described above.

An ESD event is commonly a pulse of a very high voltage typically of several kilovolts with a moderate current of a few amperes for a short period, typically about 100 nanoseconds. The common sources of an ESD event is bringing the ASIC in contact with a human body or a machine such as an integrated circuit tester and handler.

If the I/O pad 140 is contacted and subjected to an ESD event, the second power supply node Vcc2 136 and the second return node Vss2 will begin to change relative to the voltage level of the power supply voltage source Vcc. This change can cause damage in subcircuits that form an interface between the core logic section 110 and the peripheral logic section 138. "Novel Clamp Circuits for IC Power Supply Protection," Maloney et al., Proceedings EOS/ESD Symposium, 1995, pp. 1.1.1–1.1.12, Dabral et al., and U.S. Pat. No. 5,616,943 (Nguyen et al.) describe implementations clamp circuits 124 and 130. The clamp circuits prevent a differential voltage developed between the first power supply node Vcc1 108 and the second power supply node Vcc2 136 or from the first return node Vss 1 114 and the second return node Vss 2 142 from exceeding a clamp voltage. The clamp voltage is larger than the maximum allowable voltage difference between the first power supply node Vcc1 136 and the second power supply node Vcc2 136, but less than a breakdown voltage that causes damage to the subcircuits that create the interface between the core logic section 110 and peripheral logic circuit 138.

FIG. 2 shows a schematic of the clamp circuits 124 and 130 of Dabral et al., Maloney et al., and Nguyen et al. The clamp circuit 124 and 130 is connected between a first power supply terminal Vx1 200 and a second power supply terminal Vx2 205. The diodes D11 210, D12 215, . . . , D1$m$ 220 are serially connected together, cathode to anode to form a diode chain. The cathode of the first diode D11 210 is connected to the first power supply node Vx1 200. The anode of the first diode D11 210 is connected to the cathode of the next subsequent diode D12 215. The anode of the last diode D1$m$ 220 is connected to the second power supply node Vx2 205, while its cathode is connected to the anode of the next subsequent diode.

The diode chain D21 235, D22 230, . . . , D2$m$ 225 are similarly connected between the second power supply node Vx2 205 and the first power supply node Vx1 220. The cathode of the first diode D21 235 is connected to the second power supply node Vx2 205, and the anode of the last diode D2$m$ 225 is connected to the first power supply node Vx1 200.

If the voltage at the power supply node Vx2 205 rises above the total voltage required for the diode chain D11 210, D12 215, ..., D1m 220 to conduct relative to the voltage Vx1 200, the diode chain D11 210, D12 215, ..., D1m 220 will conduct, clamping the voltage between the second power supply node 205 and the first power supply node 210 to the voltage level across the diode chain D11 210, D12 215, ..., D1m 220.

Conversely, if the voltage at the power supply node Vx1 200 rises above the total voltage required for the diode chain D21 235, D22 230, ..., D2m 225 to conduct relative to the voltage Vx2 205, the diode chain D21 235, D22 230, ...., D2m 225 will conduct, clamping the voltage between the first power supply node Vx1 200 and the second power supply node 205 to the voltage level across the diode chain D21 235, D22 230,..., D2m 225.

The clamping voltage between the first power supply node Vx1 200 and the second power supply node Vx2 205 is determined by the diode voltage drop of each diode in the diode strings. The differential voltage between the first power supply node Vx2 205 should be greater than the differences in the operating voltages of the first power supply node Vx1 200 and the second power supply node Vx2 205, but less than the voltage that can cause damage in subcircuits in the interface between the core logic section 110 and the peripheral logic section 138.

Refer now to FIG. 3 for a discussion of the physical structure of a diode string as implemented on a p-type semiconductor substrate 300. The N-wells 305a, 305b, ..., 305M are diffused to a lightly doped concentration into the surface of the p-type semiconductor substrate 300 to form the cathode of the diodes DX1 350a, DX2 350B, ..., DXm 350m. The N+ contacts 310a, 310b, ..., 310m are diffused to a highly doped concentration into the N-wells 305a, 305b, ..., 305m.

A p-type material is diffused into the N-wells 305a, 305b, ..., 305m to a highly doped concentration to form the p+contacts 315a, 315b. .., 315m. The p+ contacts 315a, 315b, ..., 315m are the anodes of the diodes DX1 350a, DX2 350B, ..., DXm 350m.

The anode 315a of the first diode DX1 350 in the diode chain is connected to the first power supply terminal 320. The cathode 310a of the first diode Dx1 350 in the diode chain is connected 360 to the anode 315b of the next subsequent diode Dx2 350b. Each subsequent diode is connected cathode to anode to form the chain of diodes DX1 350a, DX2 350B, ..., DXm 350m. The cathode 310m of the last diode DXm 350m is connected to the second power supply voltage terminal V2 325.

Generally, the p-type semiconductor substrate 300 is connected to the return node Vss 330 of the power supply. This structure creates a parasitic PNP clamping transistor for each diode of the diode chain DX1 350a, DX2 350B, ..., DXm 350m. The parasitic PNP are now connected as a Darlington string of transistors. As is shown in Maloney et al., the gain of the Darlington string results in a loss of forward current to the p-type substrate 300 and thus reducing the voltage across the "downstream" diodes and increasing the current requirement for a given voltage. Further, the Darlington string amplifies the junction leakage of the "downstream" N-wells 305m, thus causing excess currents from the first power supply voltage terminal V1 320 and the second power supply voltage terminal V2 325.

U.S. Pat. No. 5,073,591 (Chen et al.) discloses an electrostatic discharge circuit. Small electrostatic voltages are used to generate charged carriers, which are used to trigger Schottky clamp diode, thereby limiting the electrostatic voltages to magnitudes significantly less than a one hundred volt breakdown. A vertical bipolar trigger transistor is formed in the semiconductor substrate adjacent the Schottky diode. The bipolar transistor is fabricated in a common emitter configuration so that it exhibits a low breakdown voltage. When the voltage of the electrostatic discharge reaches about twenty volts, the emitter-base junction of the trigger transistor becomes forward biased and the base-collector junction becomes reverse biased. The electrons and the holes generated by the avalanche breakdown of the reverse biased base-collector junction are attracted to the Schottky diode, thereby prematurely turning it on before it is driven breakdown by a much higher electrostatic voltage.

In the preferred form of Chen et al., the bipolar transistor is of PNP type. In addition, the trigger transistor is formed with the base the trigger transistor connected to a supply voltage input terminal of the integrated circuit. In this manner during normal powered operations of the circuit, any overshoot or transient voltage appearing on the input is damped to a low voltage, thereby preventing latch-up. In CMOS and MOSFET circuits, latch-up is an undesirable characteristic which can occur during power up of the circuit, or as a result of input voltage overshoots which can drive inherent parasitic SCR's into a latched state. However, during electrostatic discharge to the input, the trigger transistor is not biased by the supply voltage, but rather is biased to a higher voltage by an inherent Zener diode formed by the overall integrated circuit which is also connected to the supply voltage terminal. Chen et al. has the technical advantage of the biasing arrangement is that both latch-up immunity and electrostatic discharge protection are enhanced.

U.S. Pat. No. 5,442,217 (Mimoto) discloses a semiconductor apparatus including an electrostatic discharge protection device. The semiconductor apparatus includes a plurality of NPN transistors. The base of the NPN transistors is effectively the semiconductor substrate. The N-type diffusion of the NPN transistors forming the collector and emitter is placed under each pad of the integrated circuit constructed on the semiconductor substrate. Further, the N-type diffusion creates diodes between each pad and the semiconductor substrate. Either an electrostatic discharge greater than the operation voltages of the integrated circuit will cause the transistors or the diodes will breakdown causing the discharge currents to flow to the semiconductor substrate.

U.S. Pat. No. 5,290,724 (Leach) discloses an electrostatic discharge protection circuit between two bond pads of an integrated circuit on a semiconductor substrate. The electrostatic discharge protection circuit is group of cascaded bipolar transistors connected in series with a field effect transistor between two bond pads.

A second form of the invention of Leach discloses an output buffer that is divided into two sections. An electrostatic discharge protection circuit is triggerable in response to a voltage in the substrate. Resistive connections are provided from the sections of the output buffer to one bond pad. The output buffer is operative upon an electrostatic discharge event to inject sufficient charge into the substrate to produce the voltage to trigger the electrostatic discharge protection circuit.

U.S. Pat. No. 4,990,976 (Hattori) teaches a semiconductor device having a field effect transistor and a protective diode in parallel. The breakdown voltage of the protective diode can be altered without changing the threshold voltage of the field effect transistor. Further, the protective diode may be a Zener diode and is constructed to prevent latch-up.

U.S. Pat. No. 5,159,518 (Roy) describes an input circuit for the protection of MOS semiconductor circuits from ESD discharge voltages and from developing circuit latch-up. The input protection circuit includes and low resistance input resistor and a pair of complementary true gated diodes. Roy describes a true gated diode as a MOS structure having a gate and a drain but no source. Each true gated diode has an associated vertical parasitic bipolar transistor, which helps dissipate an Electrostatic Discharge. However, the true gate diode does not have a lateral parasitic bipolar transistor under the gate oxide. This reduces the amount of stress during an ESD event on the gated diode's gate oxide.

U.S. Pat. No. 5,208,719 (Wei) teaches a circuit that protects MOS circuits connected to an output pad of an integrated circuit from ESD, whether or not the output pad is connected to a power supply or mounted on a printed circuit board. The circuit includes a PMOS transistor connected such that the output transistor is turned on when positive ESD is present. The output NMOS transistor safely dissipates ESD current and does not enter the destructive "snapback" mode. The circuit of Roy protects the CMOS device even when it is not connected to a power supply or other devices.

U.S. Pat. No. 5,287,241 (Puar) teaches a circuit is added to a complementary metal-oxide silicon (CMOS) integrated circuit (IC) to provide an intentional, non-reversed biased VDD to VSS shunt path for transient currents such as ESD. This circuit protects the IC from ESD damage by turning on before any other path, thus directing the ESD transient current away from any easily damaged structures. Specifically, the ESD transient current is steered away from the VDD rail to the VSS rail through the on conduction of a P-channel transistor whose source and drain are connected to VDD and VSS respectively. The voltage on the gate of this transistor follows the VDD supply rail because it is drive by a delay network formed by a second transistor and a capacitor. This VDD-tracking network turns the VDD-to-VSS transistor on during a transient and off during normal operation of the IC.

U.S. Pat. No. 5,274,262 (Avery) describes an integrated circuit device to protect integrated circuits from ESD transient currents. The device is an SCR having a reduced "snapback" trigger voltage. The SCR protection circuit has a first and second bipolar transistors. The emitter of the first bipolar transistor connected to a first terminal of the circuit and to the collector of the second bipolar transistor. The base of the first bipolar transistor is connected to the collector of the second bipolar transistor. The collector of the first bipolar transistor is connected the base of the second bipolar transistor and to a second terminal. The emitter of the second bipolar transistor is connected to the second terminal. The means for reducing the trigger voltage of the SCR is connected between the bases of the first bipolar transistor and the second bipolar transistor.

U.S. Pat. No. 5,087,955 (Futami) describes a peripheral block of a semicustom integrated circuit. The peripheral block has an N-channel MOS transistor formed in close proximity to an input/output pad on a semiconductor substrate. The inpuvoutput pad has a wiring conductor connected to internal circuitry on the semiconductor substrate and to the drain of the N-channel MOS transistor. The gate and source of the N-channel MOS transistor is connected to ground. In this configuration, the N-channel MOS transistor acts as a protection diode to protect the internal circuits from transient ESD voltages. P-channel MOS transistors additionally may be connected to the input/output pad to provide paths not only to ground, but also to any power supply voltage sources on the semiconductor substrate.

SUMMARY OF THE INVENTION

An object of this invention is to provide an ESD protection circuit that will protect integrated circuits having multiple separate power supply voltage terminals from damage when an ESD event causes excessive differential voltages between the multiple separate power supply voltage terminals.

To accomplish this and other objects a voltage clamping circuit is connected between a first power supply voltage terminal and a second power supply voltage terminal to prevent a differential voltage developed between the first power supply terminal and the second power supply terminal from exceeding a first clamping voltage level and a second clamping voltage level. The second clamping voltage level being equal in magnitude and opposite in polarity to the first clamping voltage level. The voltage clamping circuit has two subgroups of Darlington connected clamping transistors. The first subgroup of Darlington connected clamping transistors is connected between the first power supply voltage terminal and the second power supply voltage terminal. If the differential voltage exceeds the first clamping voltage level, the first subgroup of Darlington connected clamping transistors turn on and restore the first differential voltage to a level less than the first clamping voltage level. The second subgroup of Darlington connected clamping transistors connected between the second power supply terminal and the first power supply terminal. Conversely, if the differential voltage exceeds the second clamping voltage level, the second subgroup of Darlington connected transistors turn on and restore the differential voltage to a level less than the second clamping voltage level.

Each subgroup of Darlington connected transistors include a first transistor, a plurality of subsequent transistors, and a last transistor. The first transistor has a base and collector connected to the first power supply voltage terminal and an emitter connected to a base of one of a subsequent adjacent transistors. The plurality of subsequent transistors each transistor has a collector connected to the first power supply terminal, an emitter connected to the base of the subsequent adjacent transistor. The last transistor has a collector connected to the first power supply terminal, a base connected to an emitter of a previous subsequent transistor and an emitter connected to the second power supply terminal.

The number of clamping transistors in the first subgroup and the second subgroup of Darlington connected clamping transistor is determined by the formula:

$$n \geq \frac{V_{noise} + |Vx1 - Vx2|}{V_T}$$

where:
    n is the number of clamping transistors in the first and second subgroups of Darlington connected clamping transistor,
    $V_{noise}$ is the voltage level of the circuit noise present on the internal circuits of the integrated circuit,
    Vx1 is the first power supply voltage source connected to the subgroup of Darlington connected clamping transistors,
    Vx2 is the second power supply voltage source connected to the subgroup of Darlington connected clamping transistors, and
    $V_T$ is the threshold voltage of each of the clamping transistors.

Each clamping transistor of the first and second subgroup of Darlington connected transistor is fabricated with a collector well of a first conductivity type having a first concentration diffused in a surface of a semiconductor substrate. At least one collector contact region of the first conductivity type having a second concentration that is greater than the first concentration is then diffused into the surface of the semiconductor substrate within the collector well to form a first low resistivity contact to the collector well. A base well of a second conductivity type, having a third concentration is diffused into the surface of the semiconductor substrate within the collector well. Within the base well, a base contact of the second conductivity type, having a fourth concentration that is greater than the third concentration is diffused into the surface of the semiconductor substrate to form a second low resistivity contact to the base well. Finally, an emitter region of the first conductivity type of the second concentration is then diffused into the surface of the semiconductor substrate within the base well separated from the base contact.

BRIEF DESCRIPTION OF THE DRAWINGS

FIG. 1 is a schematic of a power distribution network of an integrated circuit having multiple power supply voltage terminals.

FIG. 2 is a schematic diagram of a clamping diode ESD protection circuit of the prior art used to protect multiple power supply voltage terminals on an integrated circuit.

FIG. 3 is a cross sectional drawing of a clamping diode ESD protection circuit of the prior art as shown schematically in FIG. 2.

FIG. 4 is a schematic drawing of a voltage clamping circuit of this invention.

FIG. 8a is a cross sectional diagram of the clamping diode of the prior art showing the current through the clamping diode.

FIG. 8b is a plot of the current flowing in the clamping diode of the prior art vs. the voltage across the clamping diode.

DETAILED DESCRIPTION OF THE INVENTION

Figure 5:
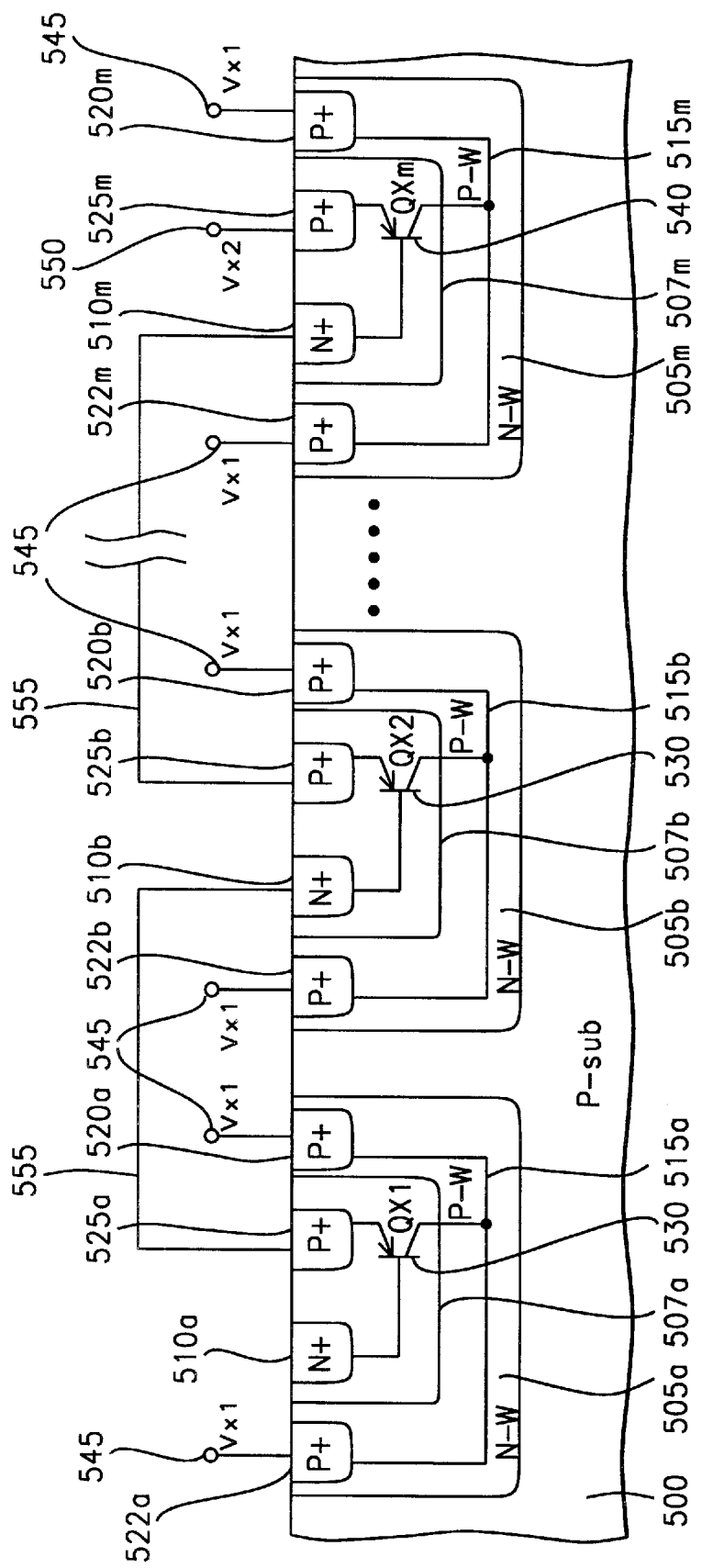
FIG. 5 is a cross sectional diagram of an implementation on a semiconductor substrate of the voltage clamping circuit of this invention.

For the discussion of the voltage clamping circuit of this invention, refer now to the schematic of FIG. 4. The first group PNP clamping transistors Q11 410, Q12 415, Q13 420, . . . , Q1$m$ 425 are connected as a Darlington amplifier. The collectors of each of the Darlington connected PNP clamping transistors Q11 410, Q12 415, Q13 420, . . . , Q1$m$ 425 are connected to the first power supply voltage terminal Vx1 400. The base of the first PNP clamping transistor Q11 410 is connected to the first power supply Vx1 400. The emitter of the first PNP clamping transistor Q11 410 is connected to the base of the next adjacent subsequent transistor Q12 415 and the base of each subsequent transistor of the first group of PNP clamping transistors Q11 410, Q12 415, Q13 420, . . . , Q1$m$ 425 is connected to the adjacent subsequent transistor in Darlington form. The emitter of the last transistor of the first group of PNP clamping transistors Q11 410, Q12 415, Q13 420, . . . , Q1$m$ 425 is connected to the second power supply voltage terminal Vx2 405.

The second group of PNP clamping transistors Q21 430, Q22 435, Q23 440, . . . , Q2$m$ 445 are connected as a Darlington amplifier as the first group of PNP clamping transistors Q11 410, Q12 415, Q13 420, . . . , Q1$m$ 425. The base of the first transistor Q21 430 is connected to the second power supply voltage terminal Vx2 405. The emitter of the first transistor Q21 430 is connected to the base of the next subsequent transistor in second group of transistors Q21 430, Q22 435, Q23 440, . . . , Q2$m$ 445. The emitters of each transistor is connected to the base of the adjacent subsequent transistor in Darlington form. The emitter of the last transistor Q2$m$ 445 is connected to the first power supply voltage terminal Vx1 400.

When the voltage level of the first power supply voltage terminal Vx1 400 has an ESD voltage or any voltage that is more negative than the cumulative base-emitter turn on voltages of the first group Darlington connected PNP clamping transistors Q11 410, Q12 415, Q13 420, . . . , Q1$m$ 425 below the voltage level of the second power supply voltage terminal Vx2 405, the first group of Darlington connected PNP clamping transistors Q11 410, Q12 415, Q13 420, . . . , Q1$m$ 425 turn on and clamp the differential voltage between the first power supply voltage terminal Vx1 400 and second power supply voltage terminal Vx2 405 to a level that is less than the voltage level that can cause damage to the circuits at the interface between the core logic section 110 and the peripheral logic section 138 of FIG. 1.

Likewise, when the voltage level of the second power supply voltage terminal has an ESD voltage or any voltage that is more negative the cumulative base-emitter turn on voltage of the second group of Darlington connected PNP clamping transistors Q21 430, Q22 435, Q23 440, . . . , Q2$m$ 445 below the first power supply voltage terminal Vx1 400, the second group of Darlington connected PNP clamping transistors turn on and clamp the differential voltage between the second power supply voltage terminal Vx2 405 and the first power supply voltage terminal Vx1 400 to a level that is less than the voltage level that can cause damage to the circuit at the interface between the core logic section 110 and the peripheral logic section 138 of FIG. 1.

It should be noted that each transistor of the Darlington connected PNP clamping transistors Q11 410, Q12 415, Q13 420, . . . , Q1$m$ 425 and Q21 430, Q22 435, Q23 440, . . . , Q2$m$ 445 has two current paths, the collector current $I_c$ and the base current $I_b$. Generally, the collector current $I_c$ is much, much greater than the base current $I_b$ ($I_c$>>$I_b$), thus the clamping transistors Q1$m$ 425 and Q2$m$ 445 absorb the majority of the ESD current during an ESD event.

The number of transistors in each group of Darlington connected PNP clamping transistors must be sufficient so as to prevent the base-emitter junctions from turning on during normal operation or having excess leakage current during normal operation. That is each group of the Darlington connected clamping transistors must not turn on or have excessive leakage current during the presence of a voltage that is the sum of the voltage level $V_{noise}$ of the noise of the normal circuit voltages and the differential voltage level |Vx1-Vx2| of the voltages present the first power supply voltage Vx1 400 and the second power supply voltage terminal Vx2 405. However, the number of transistors in each group of Darlington connected PNP clamping transistors must not be so great that the group of Darlington connected PNP clamping transistors will not conduct until the differential voltage level between the first power supply voltage terminal Vx1 400 and the second power supply voltage terminal Vx2 405 is greater than the voltage level necessary to cause damage to the circuits a the interface between the core logic section 110 and the peripheral logic section 138 of FIG. 1. The number of transistors in each group of Darlington connected PNP clamping transistors is determined by the formula:

$$n \geq \frac{V_{noise} + |Vx1 - Vx2|}{V_T}$$

where:

- n is the number of clamping transistors in the first and second subgroups of Darlington connected clamping transistor,
- $V_{noise}$ is the voltage level of the circuit noise present on the internal circuits of the integrated circuit,
- Vx1 is the first power supply voltage source connected to the subgroup of Darlington connected clamping transistors,
- Vx2 is the second power supply voltage source connected to the subgroup of Darlington connected clamping transistors, and
- $V_T$ is the threshold voltage of each of the clamping transistors.

FIG. 5 illustrates a cross section of a P-type semiconductor substrate 500 on which a group of Darlington connected PNP clamping transistors is constructed. An N-type material is diffused into the surface of the semiconductor substrate 500 to a lightly doped concentration forming the N-type wells 505a, 505b, ..., 505m. A p-type material is then diffused into the surface of the semiconductor substrate 500 within the base wells 505a505b, ..., 505m to a lightly doped concentration. The p-type material forms the collector wells 515a, 515b, ..., 515m. The N-type material is then diffused into the surface of the semiconductor substrate within the collector wells 515a, 515b, ..., 515m to form the base wells 507a, 507b, ..., 505m. The N-type material is then diffused into the surface of the semiconductor substrate 500 within the base wells 507a, 507b, ..., 505m. The N-type material is diffused to a highly doped concentration forming the contacts 510a, 510b, ..., 510m that are low resistivity contacts for the base wells 507a, 507b, ..., 507m. The base wells 507a, 507b, ..., 507m and the base contacts 510a, 510b, ..., 510m respectively are the bases of the PNP clamping transistors QX1 530, QX2 535, ..., QXm 540.

The p-type material is diffused to a highly doped concentration into the surface of the semiconductor substrate 500 within the collector wells 515a, 515b, ..., 515m. The p-type material forms the collector contacts 520a, 520b, ..., 520m and 522a, 522b, ..., 522m. The collector contacts 520a, 520b, ..., 520m and 522a, 522b, ..., 522m provide a low resistivity path to contact the collector wells 515a, 515b, ..., 515m. The collector wells 515a, 515b, ..., 515m and the collector contacts 520a, 520b, ..., 520m and 522a, 522b, ..., 522m are respectively the collectors of the PNP clamping transistors QX1 530, QX2 535, ..., QXm 540.

The p-type material is diffused into the surface of the semiconductor substrate 500 in an area within the base wells 507a, 507b, ..., 507m in an area separate from the base contacts 510a, 510b, ..., 510m. The p-type material forms the emitter contacts 525a, 525b, ..., 525m. The emitter contacts 525a, 525b, ..., 525m are the emitters of the PNP clamping transistors QX1 530, QX2 535, ..., Qxm 540.

The first power supply voltage terminal Vx1 545 is connected to each of the collector contacts 520a, 520b, ..., 520m of the PNP clamping transistors QX1 530, QX2 535, ..., QXm 540. Further, the first power supply voltage terminal VX1 545 is connected to the base contact 510a of the first transistor QX1 530 of the Darlington connected PNP clamping transistors QX1 530, QX2 535, ..., QXm 640.

The emitter contact 525m of the last transistor QXm 540 is connected to the second power supply voltage terminal VX2 50. All other emitter contacts 525a, 525b, ... are connected 555 to the bases of each adjacent subsequent PNP clamping transistor QX1 530, QX2 535, ..., QXm 540 to form the Darlington connection.

The minimum size of the emitter contacts 525a, 525b, ..., 525m is approximately 10 μm×10 μm, with the remaining diffusions sized accordingly. The physical sizes of the clamping transistors can be graded with the transistor Qxm 540 being the largest. The transistor Qxm 540 will be carrying the largest portion of the ESD current and the transistor Qx1 530 being the smallest. The grading of the transistor sizes will reduce leakage current in the Darlington connected PNP clamping transistors.

Figure 6:
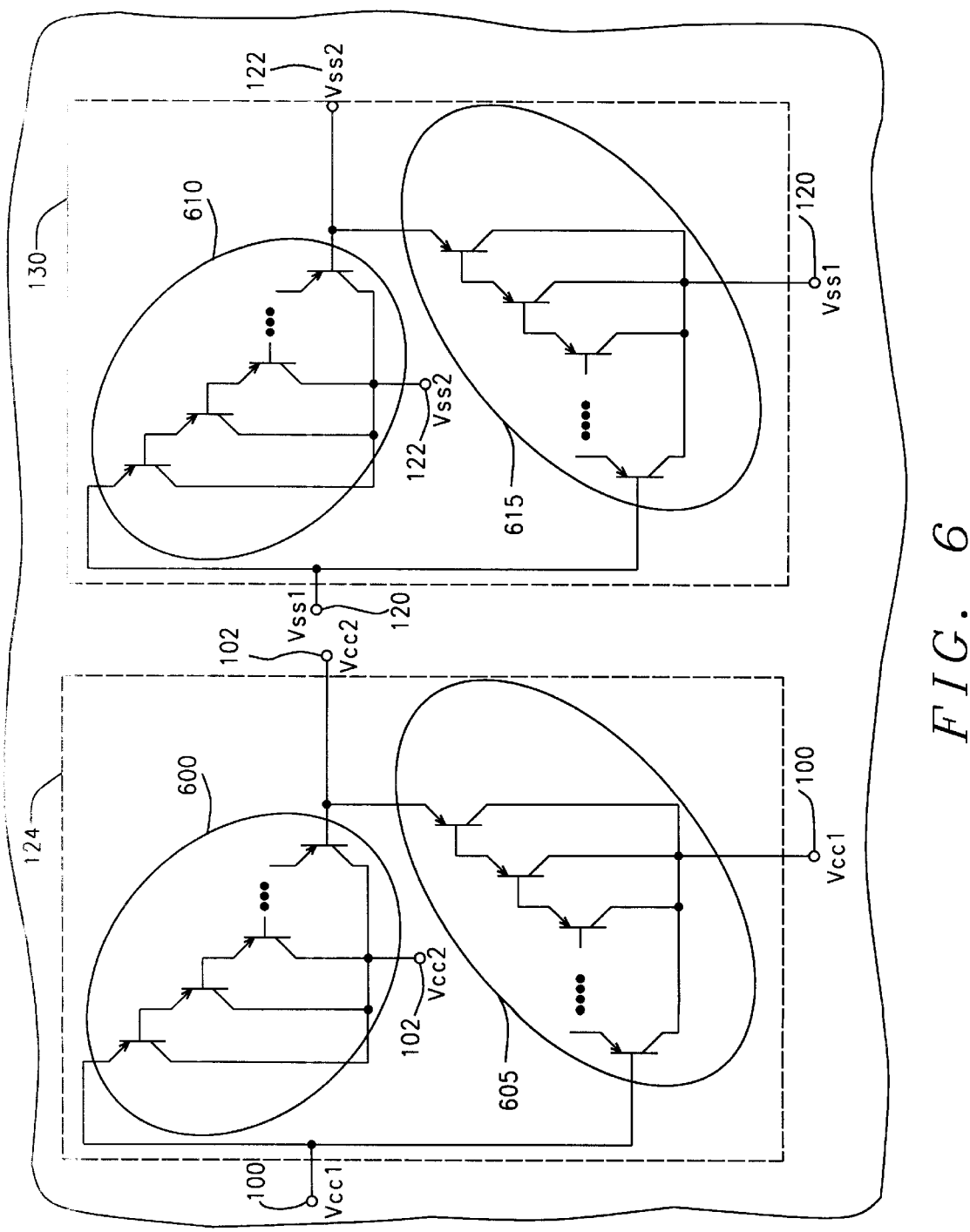
FIG. 6 is a schematic diagram of multiple voltage clamping circuits of this invention for the protection of multiple power supply voltage terminals.

FIG. 6 shows two voltage clamping circuits as connected for the clamping circuits 124 and 130 of FIG. 1. The first power supply voltage terminal Vcc1 100 and the second power supply voltage terminal 122 is connected to the first group 600 and the second group 605 of Darlington connected PNP clamping transistors. The return terminal Vss1 120 for the first power supply and the return terminal 122 for the second power supply are connected to the third group 610 and the fourth group 122 of Darlington connected PNP clamping transistors. If the voltage level at the second power supply voltage terminal Vcc2 102 becomes more negative than the turn on voltage of the first group 600 of Darlington connected PNP clamping transistors below the voltage level of the first power supply voltage terminal 100, the first group 600 of Darlington connected PNP clamping transistors turn on to clamp the differential voltage level the second power supply voltage terminal Vcc2 102 and the first power supply voltage terminal Vcc1 100 to a level that will prevent damage to the circuits at the interface between the core logic section 100 and the peripheral logic section 138 of FIG. 1.

Similarly, if the voltage level of the first power supply voltage terminal Vcc1 100 becomes more negative than the turn on voltage of the second group 605 of the Darlington connected PNP clamping transistors below the voltage level of the second power supply voltage terminal Vcc2 102, the second group 605 of the Darlington connected PNP clamping transistors turn on to clamp the differential voltage level between the first power supply voltage terminal Vcc1 100 and the second power supply voltage terminal Vcc2 102 to a level that will also prevent damage to the circuits at the interface between the core logic section 110 and the peripheral logic section 138 of FIG. 1.

Generally, the return terminals Vss1 120 and Vss2 122 of the power supplies Vcc1 and Vcc2 are connected through the distribution systems to a ground reference point. An offsetting voltage, such as an ESD event, can cause the differential voltage between the return terminal Vss1 120 and Vss2 122 to become sufficiently large to turn on either the third group 610 or fourth group 615 of the Darlington connected PNP clamping transistors. Turning either the third group 610 or the fourth group 615 of Darlington connected PNP clamping transistors clamps the differential voltage between the first return terminal 120 and second return terminal to a level to prevent damage to circuits at the interface of the core logic section 110 and the peripheral logic section 138 of FIG. 1.

Figure 7A:
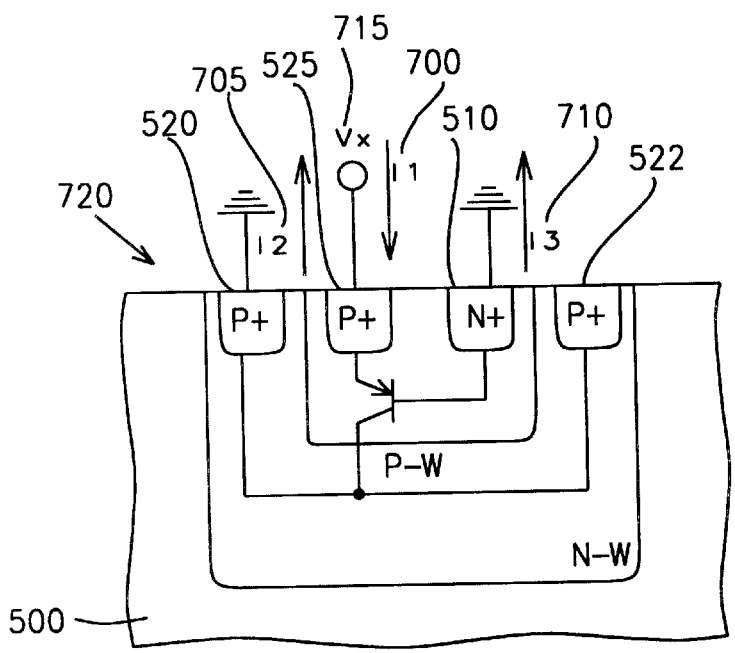
FIG. 7a is a cross sectional diagram of a clamping transistor of this invention illustrating the current flows through the clamping transistor.
Figure 7B:
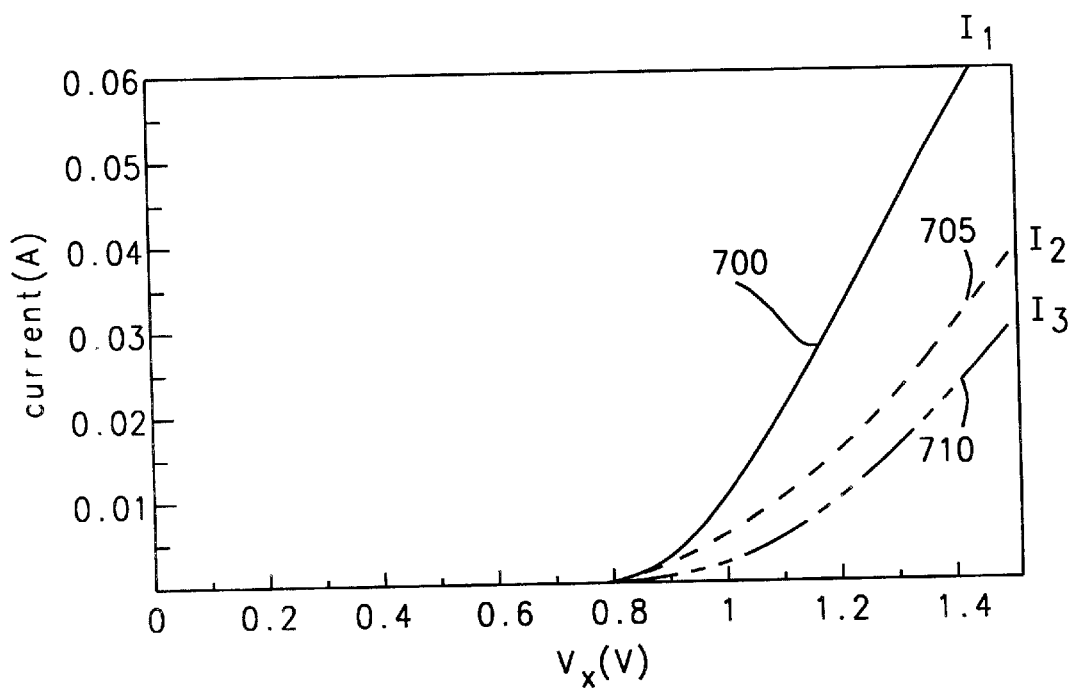
FIG. 7b is a plot of the currents flowing in the clamping transistor of this invention vs. the voltage across the clamping transistor of this invention.

Refer now to FIGS. 7a and 7b for a discussion of the current flows in a PNP clamping transistor 720 of this invention. The structure of the PNP clamping transistor 720 is as described in FIG. 5. The collector contact 520 and the base contact 510 are connected to a ground reference point and the emitter contact 525 is connected to a power supply voltage source Vx 715. The currents I1 700, I2 705, and I3 710 are shown in FIG. 7b as the power supply voltage source Vx 715 is varied. The current I1 is the total emitter current through the PNP clamping transistor 720 and is equal to the sum of the currents I2 705 and I3 710. The current I2 705 is determined by the formula:

$$I2 = \frac{\beta}{\beta+1} I1$$

where:
$\beta$ is current gain of the PNP clamping transistor 720 and is dependent on the technology of the integrated circuits incorporating the PNP Darlington clamping circuit of this invention.

The current I3 710 is determined by the formula:

$$I3 = \frac{1}{\beta} I1.$$

Refer now to FIGS. 8a and 8b to compare the current flows of this invention to the current flow of the prior art. FIG. 8a shows a diode of the clamp circuit of the prior art as structured in FIG. 3. The anode 315 of the diode DX1 350 is connected to a power supply voltage source Vx 805 and the cathode 310 of the diode DX1 350 is connected to the ground reference point. The current I1 800 flows into the anode 315 of the diode DX1 350 and out cathode 310 of diode DX1 350. FIG. 8b is a plot of the current I1 800 as the voltage Vx 800 varied from a zero level.

It is apparent that the current I1 800 of FIG. 8b will flow entirely through a diode chain D11 210, D12 215, . . . , D1m 220 of FIG. 2. However, the current I1 700 of FIG. 7b is divided into multiple paths in a subgroup of Darlington connected PNP clamping transistors Q11 410, Q12 415, Q13 420, . . . , Q1m 425 and Q21 430, Q22 435, Q23 440, . . . , Q2m 445 of FIG. 4. This allows a higher ESD current within the voltage clamping circuit of this invention to cause a faster discharge of an ESD voltage in an ESD event. This will provide additional protection from damage to integrated circuit attached to thereto.

While this invention has been particularly shown and described with reference to the preferred embodiments thereof, it will be understood by those skilled in the art that various changes in form and details may be made without departing from the spirit and scope of the invention.

The invention claimed is:

1. A voltage clamping circuit connected between a first power supply voltage terminal and a second power supply voltage terminal to prevent a differential voltage developed between the first power supply terminal and the second power supply terminal from exceeding a first clamping voltage level and a second clamping voltage level, comprising:
   a first subgroup of Darlington connected clamping transistors connected between the first power supply voltage terminal and the second power supply voltage terminal, whereby if the differential voltage exceeds the first clamping voltage level, said first subgroup of Darlington connected clamping transistors turn on and restore said first differential voltage to a level less than the first clamping voltage level; and
   a second subgroup of Darlington connected clamping transistors connected between the second power supply terminal and the first power supply terminal, whereby if the differential voltage exceeds the second clamping voltage level, said second subgroup of Darlington connected transistors turn on and restore said differential voltage to a level less than the second clamping voltage level;
   wherein each clamping transistor comprises:
      a collector well of a first conductivity type having a first concentration diffused in a surface of a semiconductor substrate;
      at least one collector contact region of the first conductivity type having a second concentration that is greater than the first concentration diffused into said surface of the semiconductor substrate within said collector well to form a first low resistivity contact to said collector well;
      a base well of a second conductivity type, having a third concentration diffused into said surface of the semiconductor substrate within said collector well;
      a base contact of the second conductivity type, having a fourth concentration that is greater than the third concentration, diffused into said surface of the semiconductor substrate within said base well to form a second low resistivity contact to said base well; and
      an emitter region of the first conductivity type of the second concentration diffused into said surface of the semiconductor substrate within the base well.

2. The voltage clamping circuit of claim 1
   whereby a first transistor of the first subgroup of Darlington connected transistors has a base and collector connected to the first power supply voltage terminal and an emitter connected to a base of a subsequent transistor;
   whereby each subsequent transistor has a collector connected to the first power supply terminal, an emitter connected to the base of an adjacent subsequent transistor; and
   whereby a last subsequent transistor of the first subgroup of Darlington connected transistors has a collector connected to the first power supply terminal, a base connected to an emitter of a previous transistor, and an emitter connected to the second power supply terminal.

3. The voltage clamping circuit of claim 1
   whereby a first transistor of the second subgroup of Darlington connected transistors has a base and collector connected to the second power supply voltage terminal and an emitter connected to a base of a subsequent transistor;
   whereby each subsequent transistor has a collector connected to the second power supply terminal, an emitter connected to the base of an adjacent subsequent transistor; and
   whereby a last subsequent transistor of the second subgroup of Darlington connected transistors has a collector connected to the second power supply terminal, a base connected to an emitter of a previous transistor, and an emitter connected to the first power supply terminal.

4. The voltage clamping circuit of claim 1 wherein a number of clamping transistors in the first subgroup and the second subgroup of Darlington connected clamping transistor is determined by the formula:

$$n \geq \frac{V_{noise} + |Vx1 - Vx2|}{V_T}$$

where:
- n is the number of clamping transistors in the first and second subgroups of Darlington connected clamping transistor,
- $V_{noise}$ is the voltage level of the circuit noise present on the internal circuits of the integrated circuit
- Vx1 is the first power supply voltage source connected to the subgroup of Darlington connected clamping transistors,
- Vx2 is the second power supply voltage source connected to the subgroup of Darlington connected clamping transistors, and
- $V_T$ is the threshold voltage of each of the clamping transistors.

* * * * *